United States Patent [19]

Dahringer et al.

[11] Patent Number: 5,689,878
[45] Date of Patent: Nov. 25, 1997

[54] METHOD FOR PROTECTING ELECTRONIC CIRCUIT COMPONENTS

[75] Inventors: Donald William Dahringer, Glen Ridge; Philip Hubbauer, Millington; William Roger Lambert, Chester; Alan Michael Lyons, New Providence; Lloyd Shepherd, Madison; John David Weld, Succasunna, all of N.J.

[73] Assignee: Lucent Technologies Inc., Murray Hill, N.J.

[21] Appl. No.: 633,331

[22] Filed: Apr. 17, 1996

[51] Int. Cl.⁶ .............. G05K 5/06; G05K 9/00; H01L 21/56
[52] U.S. Cl. .............. 29/841; 29/859; 174/52.2; 174/52.4; 206/720; 264/272.12; 361/818; 428/35.3; 428/35.8; 439/608
[58] Field of Search ............ 29/841, 859; 174/35 C, 174/35 MS File, 51, 52.2, 52.4; 206/524.6, 720, 721; 264/272.12; 361/748, 816, 818; 428/35.2, 35.3, 35.8, 35.9; 439/607, 608, 609

[56] References Cited

U.S. PATENT DOCUMENTS

| | | | |
|---|---|---|---|
| 4,965,408 | 10/1990 | Chapman et al. | 174/35 MS File |
| 5,005,106 | 4/1991 | Kiku | 361/818 |
| 5,043,195 | 8/1991 | Skrivseth | 428/35.3 |
| 5,091,229 | 2/1992 | Golike et al. | 428/35.2 |
| 5,175,033 | 12/1992 | Havens | 206/720 |
| 5,180,615 | 1/1993 | Havens | 206/720 |
| 5,232,758 | 8/1993 | Juskey et al. | 29/841 X |
| 5,274,914 | 1/1994 | Kitamura et al. | 29/859 X |
| 5,414,928 | 5/1995 | Bonitz et al. | 29/841 X |
| 5,436,803 | 7/1995 | Annis et al. | 361/818 |
| 5,455,384 | 10/1995 | Ichihara | 174/52.2 |
| 5,502,892 | 4/1996 | Lien | 29/841 |

FOREIGN PATENT DOCUMENTS

| | | | |
|---|---|---|---|
| 2347049 | 2/1975 | Germany | 29/841 |
| 4001878 | 1/1979 | Japan | 29/841 |
| 3160778 | 7/1991 | Japan | 439/608 |
| 349318 | 11/1960 | Switzerland | 29/841 |
| 92-3902 | 3/1992 | WIPO | 29/841 |

OTHER PUBLICATIONS

"A New Generation Equipment Practice For Telecom Access Network Electronics" Horma, Raychen Corporation, 1995 IEPS Conference, San Diego, California.

Primary Examiner—Peter Vo

[57] ABSTRACT

An assembly for protecting the active electronic components of an electronic product from the environment and electromagnetic interference (EMI). A method is described where the assembly is formed by providing a metallized flexible enclosure around the electronic product, such as a printed circuit board, and subsequently sealing the metallized flexible enclosure, such that separable connectors can be readily accessed without violating the integrity of the seal. The metallized flexible enclosure includes multiple layers of polymeric materials that provide diffusion barrier properties and a metallic layer that provides both diffusion barrier properties and EMI shielding capabilities. The multiple layer sheet is patterned to optimize the diffusion barrier properties and EMI shielding capabilities. Further, the multiple layer sheet enables efficient, high volume production. Thus, electronic products can be provided with an assembly having an environment protection capability and EMI shielding capability amenable to reliable and cost effective high volume production.

9 Claims, 3 Drawing Sheets

METHOD FOR PROTECTING ELECTRONIC CIRCUIT COMPONENTS

BACKGROUND OF THE INVENTION

1. Field of the Invention

The invention relates, in general, to an assembly using an enclosure for providing long-term environmental protection of and electromagnetic interference shielding capability for electronic devices.

2. Related Art

It is well known to those skilled in the art that the contents of a package can be protected from the environment by packaging the contents within an enclosure comprising multiple layer polymeric sheets with at least one metallized layer. Many examples of protecting the contents of the package can be found in the food processing industry, the medical industry, the construction industry, and the like. Basically, protecting products from atmospheric gases, water vapor or radiation to prevent spoilage or corrosion of the contents is universally employed for a wide range of products. As a result, the materials used for the multiple layer construction and composition of the package have been well developed.

Similarly, a printed circuit board (PCB) including components such as integrated circuits (ICs) is subject to degradation from environmental factors such as corrosive gases, water vapor and particulate matter. Electronic products using PCBs have primarily been located and used in controlled environments where the degree of environmental degradation to the PCB is minimal. However, electronic products are increasingly being deployed in uncontrolled environments, such as in the automotive and telecommunications industries. Furthermore, electronic products are increasingly penetrating the consumer market where the ability to produce reliable devices using low-cost and high volume manufacturing methods is of paramount importance. Thus, there is a need to derive methods for providing environmental protection for electronic products using low-cost and high volume manufacturing methods.

Conventional methods for protecting electronic products from degradation due to environmental factors include rigid enclosures and encapsulation. Rigid enclosures may be fabricated from metal or plastic and are gasketed to minimize ingress of corrosive gases, dust and water vapor, as well as, to provide an electromagnetic interference (EMI) shielding capability. While effective to a certain extent, diffusion of these species is difficult to prevent and under certain conditions even exacerbated. Expensive gaskets and other sealing methods are required to provide adequate environmental protection. Thus, rigid enclosures are generally adequate for protecting powered electronic products over the period of several years only when properly designed and when expensive precautions are taken.

Encapsulation of electronic components in terms of electronic packaging is a foundation of the semiconductor industry. However, conformal coating of the PCB or sub-assembly with, for example, a urethane or silicone compound is not capable of providing long-term environmental protection. Polymeric material compounds can provide a diffusion barrier to chemical species. In practice, however, cracking, incomplete coverage, environmental impact, and cost are issues impacting environmental protection of electronic components using urethane or silicon compounds. Also, the expense required for specific component and fixture design for large electronic products that rapidly change can negatively effect high production volume encapsulation production.

In addition to environmental protection, many electronic products that are deployed in aggressive outside environments require EMI shielding. Not only must the electronic product not be influenced by external EMI radiation, but the electronic product must not radiate excessive amounts of EMI radiation. For many electronic products, particularly in the wireless domain, EMI shielding must be provided not only at the component level of a sub-assembly, such as between certain regions of a PCB, but also at the sub-assembly (circuit board) and electronic product level. To accomplish effective EMI shielding of an electronic product or between sub-assemblies within the product, it is necessary to provide shielding plates, separate devices and ensure that all joints of an enclosure are conductively sealed. Generally, the most cost effective EMI shielding and environmental protection of electronic products has been to house the product within a metal or metallized enclosure (for example, a conductively coated plastic enclosure). However, conventional methods for imparting conductivity to the surface of plastic parts, for example, electrochemical plating, metal sputtering, and the like, are often economically prohibitive. There is a need to provide EMI shielding capability for electronic products in a manner that is both low-cost and amenable to high volume production.

Conventionally, multiple layer enclosures consisting of a metal foil or a metallized polymer sheet can be used to provide EMI shielding of electronic products. Such multi-layered enclosures are disclosed in U.S. Pat. Nos. 4,965,408 and 5,005,106 and incorporated herein by reference. A multiple layer enclosure including conductive fibers is disclosed in U.S. Pat. No. 5,436,803 and herein incorporated by reference. Related constructs of multiple layer enclosures for the purposes of providing static protection of electronic devices are disclosed in, for example, U.S. Pat. Nos. 5,180,615, 5,175,033, 5,091,229 and 5,043,195 and incorporated herein by reference. Thus, the construction and composition of enclosures for providing both environmental protection and EMI shielding capability are well known to those skilled in the art.

Furthermore, the application of enclosures formed from sheets of material consisting of polymeric and metallized layers, to impart EMI shielding capability, is known in the art. Application of these enclosures for EMI shielding of printed circuit board products is disclosed, for example, in U.S. Pat. Nos. 5,436,803 and 5,005,106 and incorporated herein by reference.

However, it is evident from the examination of these disclosures, that the method of sealing and providing for electrical interconnection is specific to the design of the electronic product, and in particular, to the design of the connector. Thus, the related art is directed toward enabling assembly to printed circuit boards with extended wires or to printed circuit boards with edge-card or connectors that extend across an entire dimension of the printed circuit board edge.

Moreover, in both U.S. Pat. Nos. 5,436,803 and 5,005,106, for example, the purpose of the enclosure is to provide EMI shielding in a flexible structure does not accommodate separable connectors. Furthermore, the related art does not address providing a hermetic seal to ensure long-term environmental protection of the electronic product, does not address the design of the flexible enclosure and does not address an appropriate sealing method to provide the hermetic seal. Typically, hermeticity is defined as a helium leak rate of not more than $1 \times 10^{-8}$ cm$^2$/sec. Here, we use the term to generally define very low permeability. In addition, the metallized layer of the enclosure is usually exposed on either the inner or outer surfaces of the enclosure to effect grounding or enhance conduction. However, in harsh environments, exposed metal surfaces will corrode.

Thus, it would be advantageous to provide a metallized flexible enclosure and a method for providing both long-term environmental protection and EMI shielding of electronic products that is cost effective, amenable to high volume production and is suitable for use with separable connectors.

SUMMARY OF THE INVENTION

An object of the invention is to provide a metallized flexible enclosure for long-term environmental protection and EMI shielding of an electronic product.

Another object of the invention is to provide a metallized flexible enclosure for an electronic product including a multiple layer sheet of material with at least one metallic layer.

Another object of the invention is to provide a method for long-term environmental protection and EMI shielding of an electronic product that is both cost effective and amenable to high volume production.

Still another object of the invention is to provide a method for assembly of a multiple layer flexible enclosure to an electronic product that incorporates separable connectors.

Another object of the invention is to connect the metallized layer directly to the electrical ground of the PCB circuit.

To achieve these and other objects, the invention is directed to a metallized flexible enclosure made from a multiple layer sheet of material. The multiple layer sheet of material includes at least one polymeric layer forming an outer surface of the enclosure for providing diffusion barrier properties, at least one metallic layer adjacent to the polymeric layer for providing electromagnetic radiation shielding properties and an electronically insulating adhesive layer forming an inner surface of the enclosure for bonding the enclosure to the electronic device. The enclosure is hermetically sealed to the electronic product, assembly or PCB to provide long-term environmental protection. The enclosure also connects the metallic layer of the multiple layer sheet of material to the electrical ground of the electronic product or assembly. Thus, environmental protection and EMI shielding of the electronic components of the PCB is performed while enabling access to the PCB's separable connectors.

The invention is also directed to a method for providing long-term environmental protection and electromagnetic interference shielding of an electronic device having electronic components and separable connectors. The method can include the steps of (1) providing a multiple layer sheet of material having at least one metallic layer, (2) forming the sheet of material into a tubular structure, (3) inserting a PCB having electronic components into the tubular structure formed from the sheet of material, (4) indexing and positioning the PCB such that the separable connectors are positioned under openings in the sheet of material, (5) exposing the separable connectors through the openings in the sheet of material, (6) compressing the tubular structure against the PCB to form an adhesive bond between the sheet of material and the PCB, (7) connecting the metallic layer of the enclosure to the electrical ground of the PCB, (8) crimping or connecting the edges of the sheet of material to form a metallized flexible enclosure, and (9) hermetically sealing the enclosure.

Using the above-described method, an assembly using the metallized flexible enclosure provides long-term environmental protection and EMI shielding while surrounding the electronic components and maintaining access to the separable connectors.

These and other aspects and advantages of the invention are described or apparent from the following detailed description taken in conjunction with the annexed drawings, which disclose preferred embodiments of the invention.

BRIEF DESCRIPTION OF THE DRAWINGS

The invention will be described with reference to the following drawings in which like reference numerals refer to like elements and wherein.

DETAILED DESCRIPTION OF THE PREFERRED EMBODIMENTS

Figure 1:
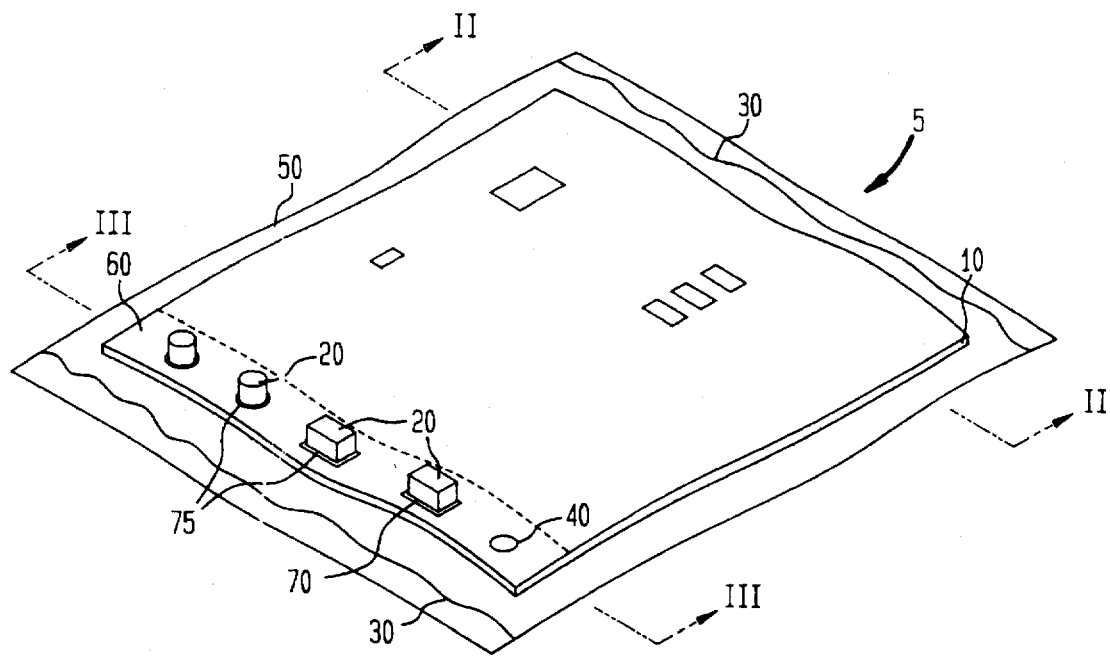
FIG. 1 shows the metallized flexible enclosure and an electronic device according to a preferred embodiment of the invention.
Figure 2:
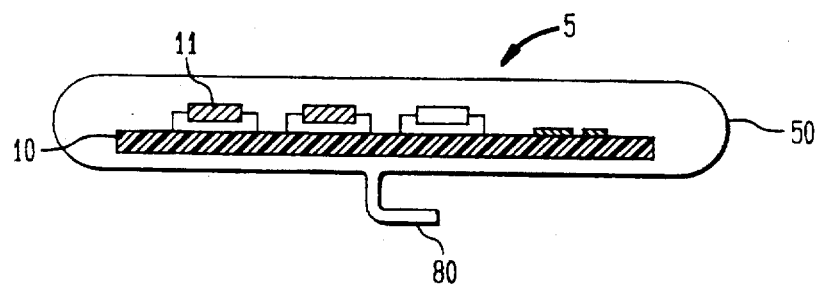
FIG. 2 is a cross sectional view along plane II—II of FIG. 1.
Figure 3:
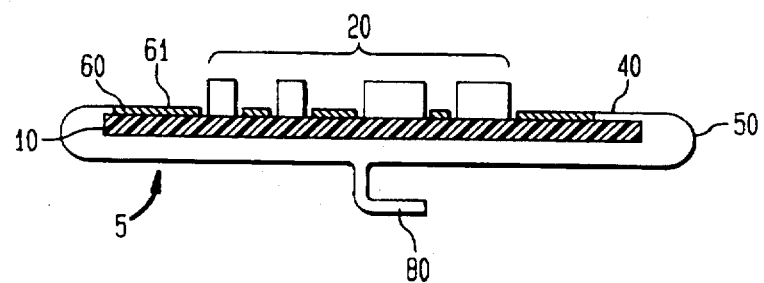
FIG. 3 is a cross sectional view along plane III—III of FIG. 1.

Generally, the invention is directed to an assembly including a metallized flexible enclosure that surrounds and attaches to an electronic product to provide long-term environmental protection and EMI shielding capability. FIGS. 1, 2 and 3 show the assembly 5 according to a preferred embodiment of the invention.

In FIG. 1, the assembly 5 includes an electronic assembly including a printed circuit board (PCB) 10 having detachable or separable connectors 20. Separable connectors 20 include, for example, press-fit pin insertion and threadedly engaged male/female connectors. Non-separable connectors are permanently attached connectors, for example, soldered wire leads or adhesively joined connectors to a circuit board. Further, the PCB 10 can be fabricated using conventional methods. A metallized flexible enclosure 50 is sealed both around a perimeter area 30 and to a PCB area 60 surrounding the separable connectors 20 to form a substantially hermetic seal. The perimeter area 30 and the PCB area 60 are such that a metallic layer 52 (FIG. 5) within the multiple layer enclosure 50 forms an electrical connection at the perimeter area 30 and the PCB area 60. A provision is made for an electrical connection to an exposed grounding pad 40 on the PCB area 60. Openings 70 in the metallized flexible enclosure 50 enable the separable connectors 20 to extend through the metallized flexible enclosure 50 to facilitate interconnection access.

The metallized flexible enclosure 50 is bonded to the PCB 10 at bonding areas 75 immediately surrounding the separable connectors 20 or over the entire PCB area 60 to provide an environmental and hermetic seal. To enhance EMI shielding capability, the bond surrounding the separable connectors 20 can be made such that an electrical connection is made between the metallic layer 52 (FIG. 5) within the metallized flexible enclosure 50 and the bonding areas 75 that surround the separable connectors 20. This can be accomplished by a conductive adhesive as explained below or the like. Alternatively, other adhesive materials and composites can be used that are laminated or printed onto the multiple layer metallized flexible enclosure 50. Likewise, mechanical fasteners or other metal bonding methods can be employed.

FIG. 2 shows a cross-sectional view of the enclosed PCB 10 across the plane II—II through the assembly 5 as shown in FIG. 1. In this embodiment, the metallized flexible enclosure 50 surrounds the PCB 10 and fits loosely over the internal components 11. As discussed below, the enclosure 50 can also be assembled to conform to the topography of the internal components 11.

Figure 4:
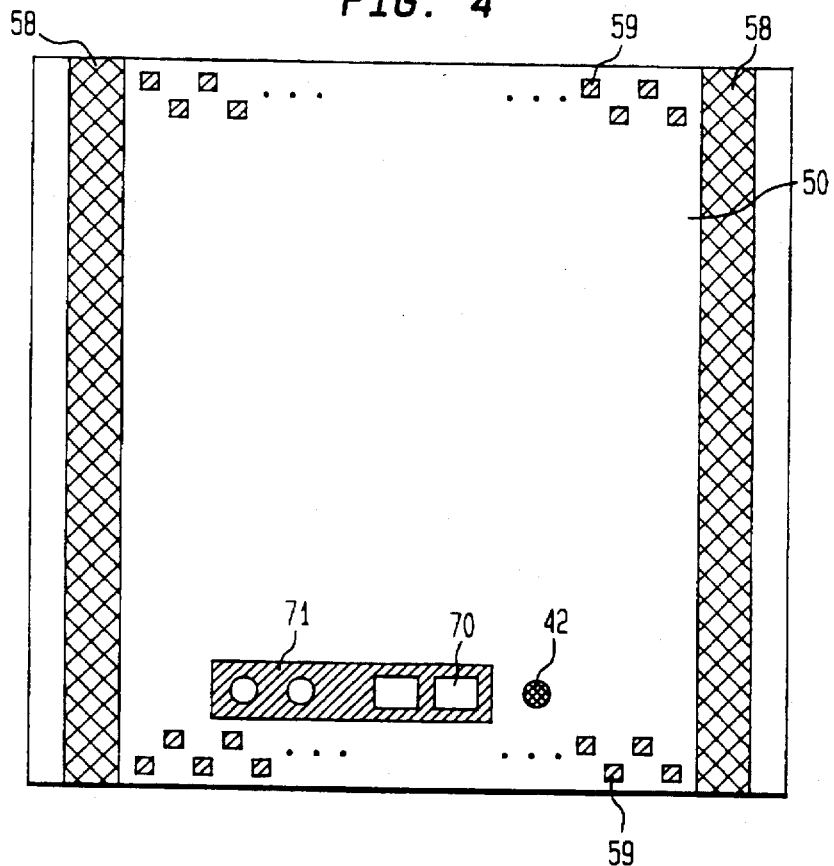
FIG. 4 is a planar view of the multiple layer sheet of material according to an embodiment of the invention.
Figure 5:
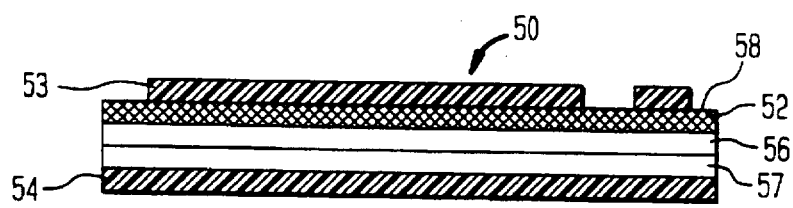
FIG. 5 is a cross sectional view of the multiple layer sheet of material of FIG. 4.
Figure 6:
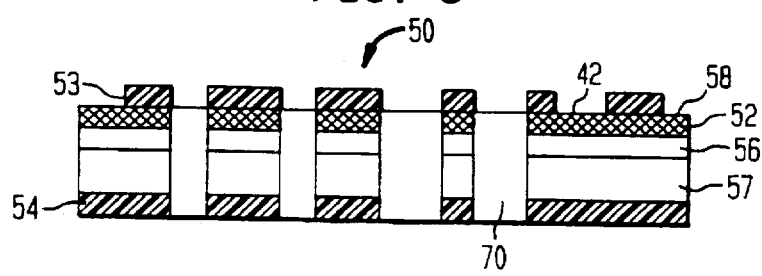
FIG. 6 is a cross sectional view of the multiple layer sheet of material of FIG. 4.

FIG. 3 shows a cross-sectional view of the assembly 5 across the plane III—III intersecting the separable connectors 20. The metallized flexible enclosure 50 is shown to be bonded to the PCB 10, both in the location immediately adjacent to connectors 61, and also over the PCB area 60 extending the width of the PCB The detailed structure of the metallized flexible enclosure 50 is shown in FIGS. 4, 5 and 6. The enclosure 50 is formed, preferably by laminating multiple layers 53 and 54 of polymeric materials selected for various desired barrier properties to the pertinent environmental threats, such as corrosive gases and water vapor. Polymeric materials such as polyethylene, ionomers such as SURLYN®, polyvinylidene chloride, and polyethylene terepthalate (PET), can be used. Further, one skilled in the art can appreciate that additional layers such as 56 and 57 of polymeric materials can be incorporated to address specific environmental threats, physical integrity or for manufacturing efficiency. The inner polymeric layer 54 preferably is an electrically insulating thermoplastic material such as polyethylene that can also be heat sealable. Other appropriate materials well known to those skilled in the art can also be used. This prevents inadvertent electrical connection of components within the sealed enclosure.

In addition to the polymeric layers 53, 54, 56 and 57, the metallized flexible enclosure 50 includes at least one metallic layer 52 disposed within the metallized flexible enclosure 50. The metallic layer 52 provides both a barrier to diffusion of the environmental threats, such as corrosive gases and water vapor, and it also enables EMI shielding for the PCB 10 and internal components 11 (FIG. 2). To provide adequate diffusion barrier properties, the metallic layer 52 should be substantially free of pin holes and provide a substantially impermeable diffusion barrier. For this reason, the metallic layer 52 is preferably a laminated foil with a thickness greater than 0.35 mils. Alternatively, a metal film can be deposited on the surface of the polymer layers by, for example, evaporation methods and other means known to those skilled in the art. For this application, the quality of the metal layer with respect to the diffusion barrier properties is more important than the absolute thickness of the metal layer. For reference, a 1.5 mil thick foil of aluminum is considered to provide a substantially impermeable diffusion barrier.

To provide additional diffusion barrier and EMI protection, more than one metallic layer may be incorporated into the metallized flexible enclosure 50. The metallic layer 52 preferably is made from aluminum because of its low cost and wide availability. However, it should be understood that other electrically conductive metals such as copper, nickel, or the like, can also be used.

In FIGS. 4, 5 and 6, the outer polymeric layer 53 adjacent to the metallic layer 52 can be patterned to expose specific areas of the metallic layer 52. Exposing areas of the metallic layer 52 enables formation of a metal-to-metal contact for providing both enhanced diffusion barrier properties and EMI shielding capabilities of the metallized flexible enclosure 50. It is envisioned that the metallic layer 52 can be exposed in the following locations: 1) opposed sides 58 of the metallized flexible enclosure 50, 2) in a region 71 adjacent to the separable connectors 20, 3) in intermittent or continuous areas 59 along opposed sides of the metallized flexible enclosure 50, and 4) at the location of the grounding pad 42 on the PCB 10. However, one skilled in the art can appreciate that the invention is not limited to exposing the metallic layer 52 in only the regions mentioned above and that the invention can be practiced by exposing the metallic layer 52 at other locations.

The locations for exposing separable connectors 20 can be formed by, for example, punching out the openings 70 in the polymeric layers 53, 54, 56 and 57 and metallic layer 52 and subsequently laminating the patterned polymeric layers 53, 54, 56 and 57 against the metallic layer 52 of the metallized flexible enclosure 50. Also, the openings 70 can be formed by cutting appropriate holes with a die prior to formation of the metallized flexible enclosure 50 into a tubular structure. Alternatively, the polymeric surface film can be printed onto the appropriate locations using a liquid adhesive that is subsequently dried or cured in a well known manner.

Although FIG. 4 shows a single metallized flexible enclosure 50, it is possible that the method for assembling the metallized flexible enclosure 50 can be an economical semi-continuous process. Specific methods for fabrication of the metallized flexible enclosure 50 and expedients for providing the openings 70 in a semi-continuous process are well known to those skilled in the art.

A method for providing the assembly 5 according to the preferred embodiment of the invention will now be described.

Figure 7:
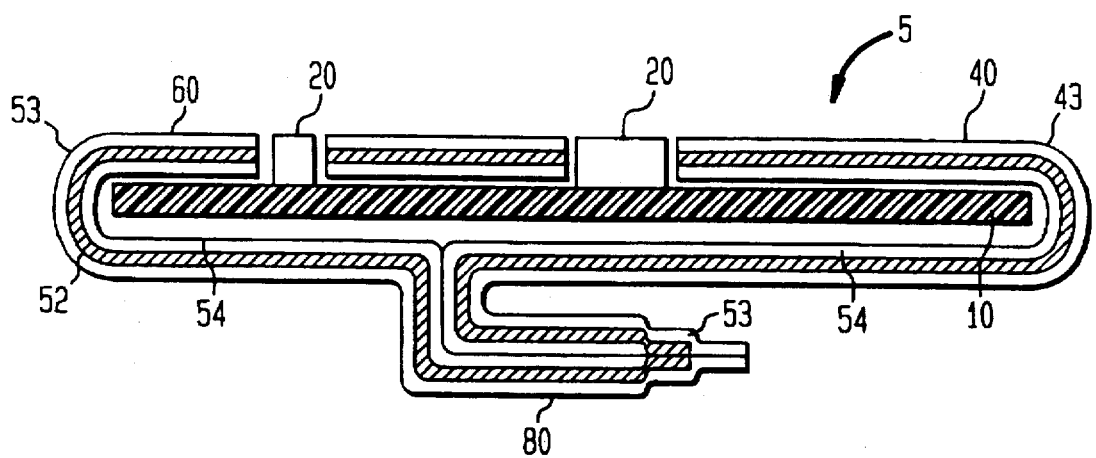
FIG. 7 is a cross sectional view of the metallized flexible enclosure and an electronic device after assembly using the preferred method of the invention.

Referring now to FIG. 7, the metallized flexible enclosure 50 is first formed as a tube and the electronic device including the PCB 10 and the separable connectors 20 is inserted into the tube. As shown, the metallized flexible enclosure 50 comprises three layers: 1) the inner polymer layer 54, 2) the embedded metallic layer 52, and 3) the outer polymer layer 53. As previously described, the polymer layers 53, 54 include polymeric material that can be formed into a seal at the perimeter area 30 and the PCB area 60. For example, the inner polymer layer 54 and the outer polymer layer 53 can both be made of a thermoplastic or other material that is heat sealable. Alternatively, the adhesive may be printed onto the surface of the multiple layer sheet. The polymer layers 53, 54 can also be electrically insulating, thereby preventing the metallized layer 52 from forming an unwanted electrical connection to external or internal parts, for example, the active electronic circuitry on the PCB 10.

Next, the layers 52, 53 and 54 of the metallized flexible enclosure 50 are directly bonded along seam 80 by thermal bonding to form both a metallic bond and a polymeric seal to provide a complete EMI shielding capability and a hermetic seal. Alternatively, the metallic bond at the seam 80 can be formed by thermal or ultrasonic bonding with compression. The polymeric seal can also be formed by thermal compression. In addition, corrugation can be incorporated to enhance the metallic bond strength and the metal-to-metal contact of the seam 80. The width of the seam 80 is selected to provide the desired performance. One skilled in the art can appreciate that alternative bonding locations and schemes can be used.

Then, seals in the perimeter area 30 (FIG. 1) at the ends of the metallized flexible enclosure 50 are also formed by similar methods to those described above for the seam 80. Electrical contact of the metallic layer 52 can be performed by mechanically connecting the metallic layer 52 during the bonding process or by exposing openings in the sides 58 and the areas 59, for example, in the surface of the inner polymeric layer 54. The spacing and dimensions of the openings in the sides 58 and the areas 59 are determined by the EMI shielding capability requirements. To enhance EMI shielding capability, it is desirable to have a continuous metal-to-metal seal around the perimeter of the flexible enclosure. Also, electrical contact between the metallic layer 52 and the PCB electrical grounding pad 40 is provided by the region (opening) 42 in the inner polymeric layer 54 within the flexible enclosure 50.

Next, the electronic device is indexed and positioned such that the separable connectors 20 are situated under the respective openings 70 in the metallized flexible enclosure 50. In the preferred embodiment of the invention, the sides of the tubular structure are then pulled outward to cause the connectors 20 to extend through the openings 70 in the metallized flexible enclosure 50. A heated platen (not shown) with cavities enabling recession of the separable connectors 20 presses against the metallized flexible enclosure 50, and compresses the metallized flexible enclosure 50 against the PCB 10 to form the adhesive bond. At the same time, the electrical connection between the metallic layer 52 and the grounding pad 40 can be made by thermal compression bonding, mechanical fastening, by using a conductive adhesive or the like. Then, the ends of the tube are crimped and sealed, as previously described, to form the metallized flexible enclosure 50.

Rather than have the metallized flexible enclosure 50 fit loosely around the electronic product, it may be desirable to have the metallized flexible enclosure 50 conform to the shape of the internal components 11. Vacuum lamination with a heated bladder or compressible material can cause the metallized flexible enclosure 50 to press against the internal components 11. During the sealing process, the metallized flexible enclosure 50 can also be backfilled with an inert gas, such as nitrogen gas, or with dry air to provide noncorrosive atmospheric conditions for the internal components 11. It may also be desirable to remove ambient air using a vacuum to vacuum pack the components and/or outgassing the electronic product prior to sealing the metallized flexible enclosure.

In FIG. 7, the inner polymer layer 54 of the metallized flexible enclosure 50 is thermally bonded to cause the inner polymer layer 54 to melt directly to the PCB 10 at the PCB area 60 (FIG. 1) along the edge of the PCB 10. However, it is envisioned that other adhesive systems and methods can be employed. For example, a heat sensitive adhesive material can be applied either to the metallized flexible enclosure 50 on top of the inner polymer layer 54, or an adhesive can be applied to the PCB 10 at the appropriate bonding location. Alternatively, it may be preferable to bond the metallized flexible enclosure 50 to the PCB 10 at locations adjacent to the connectors 61 rather than over the entire PCB area 60. Furthermore, one skilled in the art can appreciate that the metallized flexible enclosure 50 can be bonded to the PCB 10 at other locations not discussed above.

The heat generated by the electronic product can be essentially contained within the metallized flexible enclosure 50. As a result, the ambient temperature within the metallized flexible enclosure 50 will increase. The temperature within the metallized flexible enclosure 50 can be controlled to prevent adversely affecting the electronic components. In addition, the thermal gradient between the inside and outside of the flexible enclosure 50 can serve as an additional positive impediment to the ingress of contaminants, such as water vapor. In situations where excessive heat is a concern, mechanisms for efficiently removing the heat can be used. For example, a heat sink (not shown) situated external to the metallized flexible enclosure 50 can be attached to and compressed against a heat generating component on the PCB 10. Alternatively, the metallized layer 52 can be exposed as previously discussed to facilitate heat transfer either with or without a heat sink. Thus, the metallized flexible enclosure 50 provides a substantially permanent and inviolable containment for the PCB 10 and internal components 11 of assembly 5. As such, the metallized flexible enclosure 50 provides long-term or product lifetime environmental and physical protection for the PCB 10 where the only access to the PCB 10 and the internal components 11 is the separable connectors 20.

While the metallized flexible enclosure 50 can be removed for repair or end-of-life processing, it is not recommended because removal of the metallized flexible enclosure 50 can compromise the long-term environmental and physical protection of the PCB 10 and the internal components 11. Furthermore, to ensure the integrity of the environmental seal, it is recommended that mounting methods for the assembly 5 that can puncture the metallized flexible enclosure 50 should be avoided. Instead, sliding mounts or compressive mechanisms (not shown) are preferred methods for securing the assembly 5 to the electrical system (not shown).

While this invention has been described in conjunction with specific embodiments, it is evident that many alternatives, modifications and variations will be apparent to those skilled in the art. Accordingly, the preferred embodiments of this invention as set forth herein are intended to be illustrative, rather than limiting. Various changes may be made without departing from the spirit and scope of the invention as defined in the following claims.

We claim:

1. A method for protecting an electric assembly including a printed circuit board (PCB) having electronic components and separable connectors thereon, comprising the steps of:

forming a sheet of material having a plurality of openings therein into a tubular structure, the sheet of material including at least a metallic layer and an adhesive layer;

inserting the PCB into the tubular structure;

indexing and positioning the PCB such that the separate connectors are positioned under said openings in the tubular structure;

exposing the separable connectors through the openings in the tubular structure;

compressing the tubular structure against the PCB, thereby adhesively bonding between the tubular structure and the PCB;

connecting peripheral areas surrounding the PCB of the metallic layer to a circuit ground of the PCB;

forming a metallized flexible enclosure by crimping or connecting the sheet of material; and sealing the metallized flexible enclosure to form a hermetic seal, whereby the metallized flexible enclosure provides environmental protection and electromagnetic interference shielding to the electronic components while providing access to the separable connectors.

2. The method of claim 1, further comprising the step of vacuum laminating the tubular structure to press the tubular structure against the electronic components.

3. The method of claim 1, further comprising the step of backfilling the flexible enclosure with a gas during the sealing step.

4. The method of claim 1, wherein the metallic layer is connected in the connecting step by using a conductive adhesive.

5. The method of claim 1, wherein the tubular structure is sealed in the sealing step by using a corrugated tool.

6. The method of claim 1, wherein the tubular structure is sealed in the sealing step by using heat.

7. The method of claim 1, wherein the tubular structure is sealed in the sealing step by using ultrasonics.

8. The method of claim 1, wherein the metallic layer is connected in the connecting step by using ultrasonic bonding.

9. The method of claim 1, further comprising the step of folding the sheet of material over the PCB prior to the sealing step.

* * * * *